United States Patent
Yao

(10) Patent No.: US 10,317,758 B2
(45) Date of Patent: Jun. 11, 2019

(54) ARRAY SUBSTRATE AND DISPLAY DEVICE

(71) Applicant: BOE Technology Group Co., Ltd., Beijing (CN)

(72) Inventor: Xing Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 151 days.

(21) Appl. No.: 14/409,217

(22) PCT Filed: Jun. 30, 2014

(86) PCT No.: PCT/CN2014/081130
§ 371 (c)(1),
(2) Date: Dec. 18, 2014

(87) PCT Pub. No.: WO2015/096438
PCT Pub. Date: Jul. 2, 2015

(65) Prior Publication Data
US 2016/0274432 A1      Sep. 22, 2016

(30) Foreign Application Priority Data

Dec. 26, 2013   (CN) .......................... 2013 1 0731356

(51) Int. Cl.
*H01L 27/12* (2006.01)
*G02F 1/1362* (2006.01)
(Continued)

(52) U.S. Cl.
CPC ...... *G02F 1/136286* (2013.01); *G02F 1/1368* (2013.01); *G02F 1/13394* (2013.01);
(Continued)

(58) Field of Classification Search
CPC .... G02F 1/1362; G02F 1/1339; G02F 1/1368; H01L 27/12
(Continued)

(56) References Cited

U.S. PATENT DOCUMENTS 7,700,949 B2 *   4/2010  Song et al. ..................... 257/59
7,777,854 B2 *   8/2010  Moon ........................... 349/149
(Continued)

FOREIGN PATENT DOCUMENTS

CN   1517751 A   8/2004
CN   1885105 A   12/2006
(Continued)

OTHER PUBLICATIONS

Apr. 8, 2016—(CN)—Second Office Action Appn 201310731356.8 with English Tran.
(Continued)

*Primary Examiner* — Sheng-Bai Zhu
(74) *Attorney, Agent, or Firm* — Banner & Witcoff, Ltd.

(57) ABSTRACT

An array substrate and a display device having the array substrate are provided. The array substrate comprises a display region and a non-display region disposed at the periphery of the display region. The non-display region comprises a gate driver region (GOA region), which comprises a first patterned metal layer formed on a base substrate, a first insulating layer formed on the first patterned metal layer, a second patterned metal layer formed on the first insulating layer, a second insulating layer covering the second patterned metal layer, and a third patterned metal layer formed at a side of the second insulating layer away from the base substrate. The third patterned metal layer comprises a plurality of metal wires insulated from each other and connected to the first patterned metal layer and the second patterned metal layer respectively by through holes and used as connecting lines between elements of the gate driver.

13 Claims, 3 Drawing Sheets

(51) Int. Cl.
*G02F 1/1339* (2006.01)
*G02F 1/1368* (2006.01)

(52) U.S. Cl.
CPC ...... *G02F 1/136227* (2013.01); *H01L 27/124* (2013.01); *H01L 27/1244* (2013.01); *H01L 27/1248* (2013.01); *G02F 2001/13629* (2013.01)

(58) Field of Classification Search
USPC .................................. 257/72, 40; 438/30, 34
See application file for complete search history.

(56) References Cited

U.S. PATENT DOCUMENTS

| | | | |
|---|---|---|---|
| 2001/0000755 A1* | 5/2001 | Hirakata et al. | 438/149 |
| 2002/0068388 A1 | 6/2002 | Murakami et al. | |
| 2004/0141128 A1 | 7/2004 | Kim et al. | |
| 2006/0202214 A1* | 9/2006 | Yang | 257/88 |
| 2006/0289939 A1 | 12/2006 | Kim et al. | |
| 2007/0158729 A1 | 7/2007 | Yang et al. | |
| 2007/0197019 A1 | 8/2007 | Kang et al. | |
| 2008/0169473 A1* | 7/2008 | Cho | 257/72 |
| 2008/0230770 A1* | 9/2008 | Yoon et al. | 257/40 |
| 2009/0231310 A1* | 9/2009 | Tsai | H01L 27/1288 345/205 |
| 2010/0045916 A1 | 2/2010 | Kim et al. | |
| 2011/0026099 A1* | 2/2011 | Kwon et al. | 359/296 |
| 2012/0061673 A1* | 3/2012 | Yamazaki | H01L 27/1225 257/59 |

FOREIGN PATENT DOCUMENTS

| | | |
|---|---|---|
| CN | 1992292 A | 7/2007 |
| CN | 101013240 A | 8/2007 |
| CN | 101383327 A | 3/2009 |
| CN | 103454819 A | 12/2013 |
| CN | 103676382 A | 3/2014 |

OTHER PUBLICATIONS

International Search Report and Written Opinion dated Sep. 28, 2014 (PCT/CN2014/081130); ISA/CN.

Sep. 28, 2014—International Search Report and the Written Opinion Appn PCT/CN2014/081130 with Eng Tran.

Sep. 22, 2015—(CN)—First Office Action Appn. 201310731356.8 with Eng Tran.

* cited by examiner

ARRAY SUBSTRATE AND DISPLAY DEVICE

The application is a U.S. National Phase Entry of International Application PCT/CN2014/081130 filed on Jun. 30, 2014, designating the United States of America and claiming priority to Chinese Patent Application No. 201310731356.8, filed on Dec. 26, 2013. The present application claims priority to and the benefit of the above-identified applications and the above-identified applications are incorporated by reference herein in their entirety.

TECHNICAL FIELD

Embodiments of the present invention relate to an array substrate and a display device with the array substrate.

BACKGROUND

A thin film transistor liquid crystal display (TFT-LCD) is a common liquid crystal display. In the TFT LCD, each gate line needs to be connected to a corresponding gate driver to drive a thin film transistor disposed in each pixel unit in a display region, so as to display an image. As one kind of gate driver technology, the Gate Driver on Array (GOA) technology is now commonly utilized in the field of TFT-LCD. In GOA, the gate driver is fabricated directly in a GOA region on an array substrate in place of externally connected driving chips.

As known by an inventor, a wiring of the gate driver in the GOA region is implemented by metal wires disposed in two layers, by using the metal wires respectively in the same layer as a gate driving element, such as a gate and source/drain of thin film transistor as connecting lines of a gate driver.

However, to avoid a short circuit caused by an intersection of the metal wires or too narrow space between the metal wires in the same layer, a space between any two metal wires in the GOA region is relatively large, thus, resulting in a relatively large width of the GOA region, which makes a limitation to a narrow-frame design. Furthermore, it is easy for the metal wires in the same layer to be intersected or have too narrow space therebetween, thus, which is likely to cause the short circuit.

SUMMARY

Embodiments of the present invention provide an array substrate and a display device having the array substrate, which can satisfy the requirement of narrow-frame design and avoid a short circuit caused by an intersection of the metal wires or too narrow space between the metal wires in a GOA region.

In one aspect, an embodiment of the present invention provides an array substrate, a display region; a non-display region, disposed at the periphery of the display region, comprising: a gate driver region (GOA region), comprising: a first patterned metal layer, formed on a base substrate; a first insulating layer, formed on the first patterned metal layer; a second patterned metal layer, formed on the first insulating layer; a second insulating layer, covering the second patterned metal layer; and a third patterned metal layer, formed at a side of the second insulating layer away from the base substrate, wherein the third patterned metal layer comprises a plurality of metal wires insulated from each other and connected to the first patterned metal layer and the second patterned metal layer respectively by through holes and used as connecting lines between elements of the gate driver.

In another aspect, an embodiment of the present invention also provides an array substrate as mentioned above; and an opposed substrate, cell-assembled with the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

Figure 1:
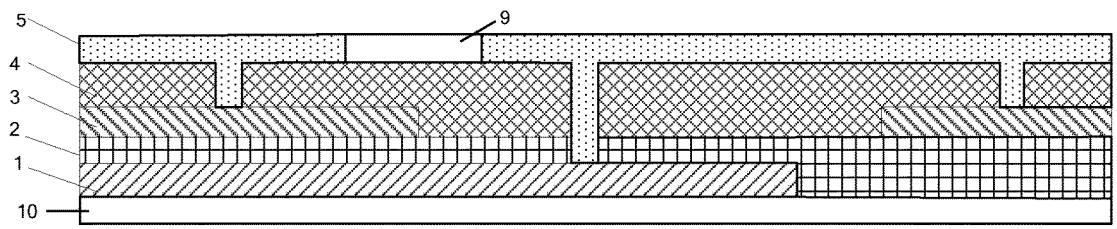
FIG. 1 is a schematic cross-sectional view of a GOA region of an array substrate according to a first embodiment of the present invention.

The first embodiment of the present invention provides an array substrate comprising a display region and a non-display region at the periphery of the display region, the non-display region comprises a gate driver region (a GOA region). FIG. 1 is a cross-sectional view of the GOA region. As shown in FIG. 1, the GOA region comprises: a first patterned metal layer 1, formed on a base substrate 10; a first insulating layer 2, formed on the first patterned metal layer 1; a second patterned metal layer 3, formed on the first insulating layer 2; and a second insulating layer 4, covering the second patterned metal layer 3, wherein at a side of the second insulating layer 4 away from the base substrate, a third patterned metal layer 5 is formed and comprises a plurality of metal wires respectively connected to the first patterned metal layer 1 and the second patterned metal layer 3 by through holes and used as connecting lines between elements of a gate driver. Therefore, by disposing the connection lines of the gate driver in the third patterned metal layer, the space occupied by wirings in the GOA region is reduced, thus, a width of the GOA region can be reduced and the narrow-frame design can be achieved.

Exemplarily, at least one of the plurality of metal wires is used to connect the first patterned metal layer and the second patterned metal layer; or, all of the plurality of metal wires are used to connect the first patterned metal layer and the second patterned metal layer.

FIG. 1 is a schematic view showing a case in that a metal wire in the third patterned metal layer 5 connects a gate in the first patterned metal layer 1 and another source/drain in the second patterned metal layer 3, but this is only an example and the third patterned metal layer may implement various connections in practice.

Figure 4A:
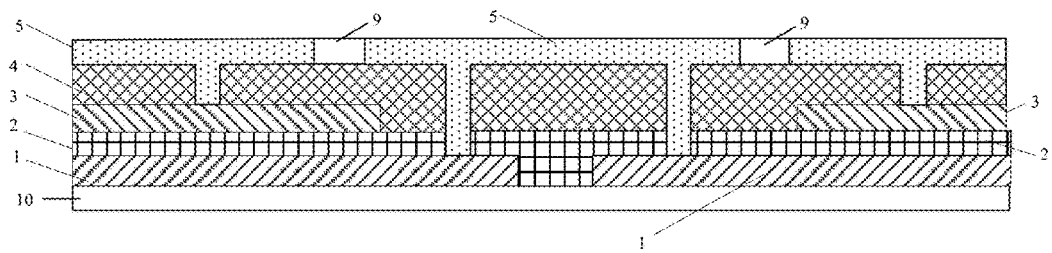
FIG. 4A is a schematic cross-sectional view of a GOA region of an array substrate according to a fourth embodiment of the present invention.
Figure 4B:
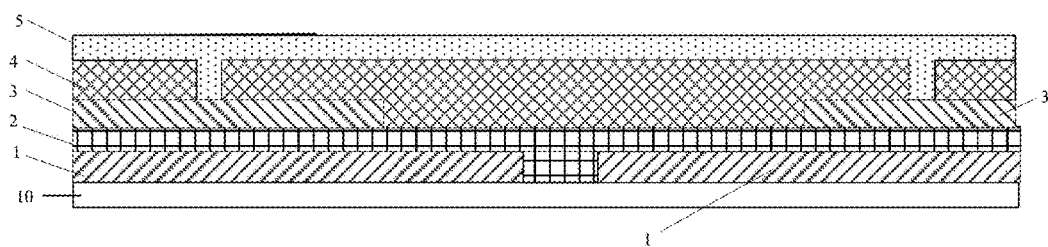
FIG. 4B is a schematic cross-sectional view of a GOA region of an array substrate according to a fifth embodiment of the present invention.
Figure 7:
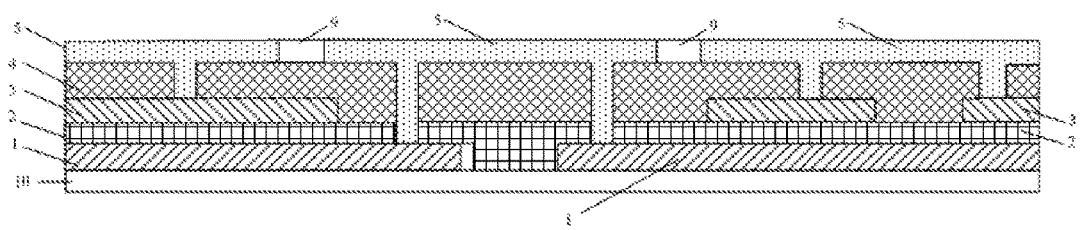
FIG. 7 is a schematic cross-sectional view of a GOA region of an array substrate according to a seventh embodiment of the present invention.

Alternatively, the plurality of metal wires further comprise a metal wire with one end connected to a metal pattern in the first patterned metal layer and the other end connected to another metal pattern in the first patterned metal layer (as shown in FIG. 4A and FIG. 7) and/or a metal wire with one end connected to a metal pattern in the second patterned metal layer and the other end connected to another metal pattern in the second patterned metal layer (as shown in FIG. 4B and FIG. 7).

Figure 5:
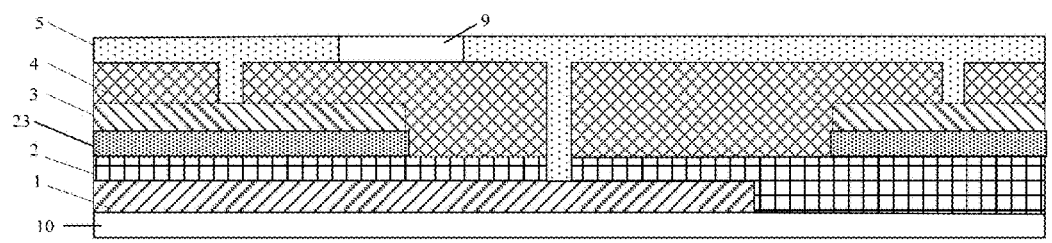
FIG. 5 is a schematic cross-sectional view of a GOA region of an array substrate according to a sixth embodiment of the present invention.

Exemplarily, a driving element disposed in the GOA region is, for example, a thin film transistor, and in a condition that the thin film transistor is a bottom-gate type thin film transistor, the first patterned metal layer 1 comprises a gate, the first insulating layer 2 is a gate insulating layer, the second patterned metal layer 3 comprises a source/drain, and the second insulating layer 4 is a passivation layer. In addition, a patterned active layer 23 is disposed between the first insulating layer 2 and the second patterned metal layer 3 in the GOA region for forming a channel of the thin film transistor, as shown in FIG. 5.

Figure 6:
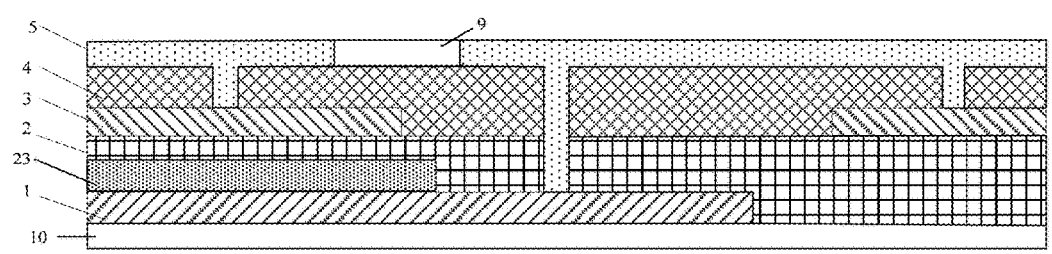
FIG. 6 is a schematic cross-sectional view of a GOA region of an array substrate according to a seventh embodiment of the present invention.

Exemplarily, the driving element disposed in the GOA region is, for example, a thin film transistor, and in a condition that the thin film transistor is a top-gate type thin film transistor, the first patterned metal layer 1 comprises a source/drain, the first insulating layer 2 is a gate insulating layer, the second patterned metal layer 3 comprises a gate, and the second insulating layer 4 is a passivation layer. In addition, a patterned active layer 23 is disposed between the first patterned metal layer 1 and the first insulating layer 2 in the GOA region, as shown in FIG. 6.

Exemplarily, when a plurality of thin film transistors are disposed in the GOA region, as shown in FIG. 1, at least one metal wire in the third patterned metal layer is used to connect a gate of a thin film transistor and a source/drain of another thin film transistor. Alternatively, a metal wire in the third patterned metal layer may connect a patterned metal in the first patterned metal layer and a patterned metal in the second patterned metal payer as required by a GOA circuit, those skilled in the art may make an option based on the actual requirement and FIG. 1 only shows an example and does not make any limitation to an embodiment of the present invention.

Alternatively, the plurality of metal wires are insulated from each other by an insulating layer 9 coplanar with the third patterned metal layer 5.

In this way, in the array substrate according to an embodiment of the present invention, the third patterned metal layer is further disposed in the GOA region, and the metal wires in the third patterned metal layer may be used as connecting lines of an element in a gate driver and as some or all of signal lines of the gate driver. As a result, the locations of the signal lines and the connecting lines are transferred from the same layer as the elements to over the elements, and the first patterned metal layer and the second patterned metal layer of the gate driver can be connected by one metal wire using through holes, thus, an area of the GOA region can be greatly reduced.

A Second Embodiment

Since the third patterned metal layer 5 is connected to the first patterned metal layer 1 and the second patterned metal layer 3 respectively by the through holes, in the present embodiment, a transparent conducting layer 7 is further formed between the second insulating layer 4 and the third patterned metal layer 5 based on the structure in the first embodiment so as to avoid the third patterned metal layer 5 to be broken at positions where the through holes are disposed.

Figure 2:
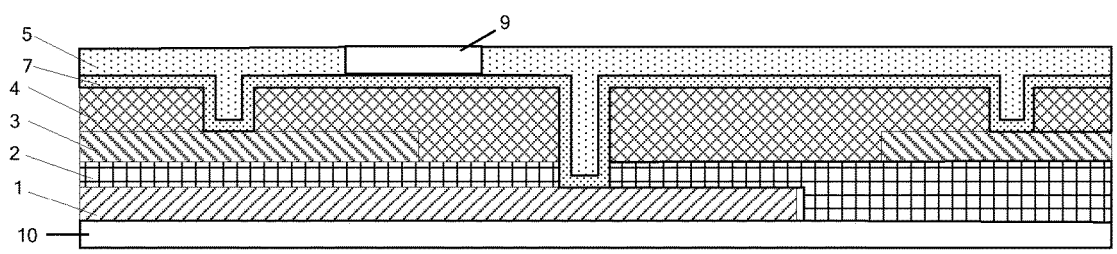
FIG. 2 is a schematic cross-sectional view of a GOA region of an array substrate according to a second embodiment of the present invention.

As shown in FIG. 2, an array substrate comprises a first patterned metal layer 1, a first insulating layer 2, a second patterned metal layer 3, a second insulating layer 4, the transparent conducting layer 7 and a third patterned metal layer 5 formed in a GOA region on a base substrate 10, wherein the third patterned metal layer 5 comprises a plurality of metal wires insulated from each other and connecting the first patterned metal layer 1 and the second patterned metal layer 3 respectively by using through holes. By disposed the transparent conducting layer 7 as an interlayer, the third patterned metal layer 5 can be avoided to be broken at positions where the through holes are disposed.

Exemplarily, the transparent conducting layer and the plurality of metal wires in the third patterned metal layer are conformal, especially, at the through holes of the second insulating layer 4, the transparent conducting layer and the plurality of metal wires in the third patterned metal layer are conformal.

A Third Embodiment

In the present embodiment, a third insulating layer 6 is formed between the second insulating layer 4 and the transparent conducting layer 7 based on the structure according to the second embodiment so as to reduce a capacitance between the third patterned metal layer 5 and the second patterned metal layer 3 and the first patterned metal layer 1. Herein, a through hole is formed in the third insulating layer and a thickness of the third insulating layer 6 is in a range of 1~2 μm. Within this thickness range, the capacitance between the third patterned metal layer and a thin film transistor in the GOA region can be effectively reduced, and the feasibility of the process can be insured (the thickness of the third patterned metal layer being very large will lead to the great processing difficulty) and the utilization effect of the array substrate can be guaranteed.

Figure 3:
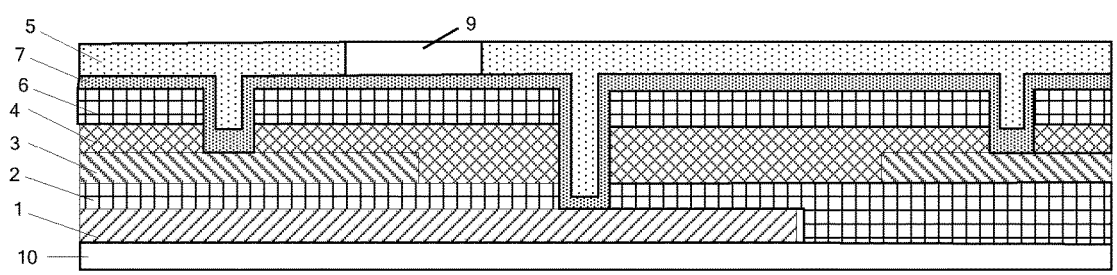
FIG. 3 is a schematic cross-sectional view of a GOA region of an array substrate according to a third embodiment of the present invention.

As shown in FIG. 3, an array substrate comprises a first patterned metal layer 1, a first insulating layer 2, a second patterned metal layer 3, a second insulating layer 4, the third insulating layer 6, a transparent conducting layer 7 and a third patterned metal layer 5 formed in a GOA region on a base substrate 10, wherein the third patterned metal layer 5 comprises a plurality of metal wires insulated from each other and connecting the first patterned metal layer 1 and the second patterned metal layer 3 respectively by using through holes. By adding the third insulating layer 6, the parasitic capacitance between the third patterned metal layer 5 and the first patterned metal layer 1 and between the third patterned metal layer 5 and the second patterned metal layer 3 can be reduced, interference to signals can be reduced and the display quality can be improved.

A Fourth Embodiment

The present embodiment is different from the third embodiment only in that the array substrate does not comprise a transparent conducting layer 7, and a third insulating layer 6 with through holes formed therein is directly formed between the second insulating layer 4 and the third patterned metal layer 5.

A Fifth Embodiment

The fifth embodiment of the present invention provides a display device comprising: an array substrate according to any one of the first to the fourth embodiments described above; and an opposed substrate, cell-assembled with the array substrate. The display device may be a liquid crystal television set, a smartphone or a tablet computer, etc.

Exemplarily, in a technical solution according to embodiments of the present invention, material of the metal wires in the third patterned metal layer may be commonly used material, for example, a metal for a gate or a source/drain, those skilled in the art may make a selection according to the actual situation, which is not limited in embodiments of the present invention.

With the array substrate according to an embodiment of the present invention, a third patterned metal layer is further disposed in a GOA region, and metal wires therein may be used as connecting lines of elements in a gate driver and as some or all of signal lines in the gate driver. As a result, the locations of the signal lines and the connecting lines are transferred from the same layer as the elements to over the elements, and the first patterned metal layer and the second patterned metal layer of the gate driver can be connected by one metal wire using through holes, thus, an area of the GOA region can be greatly reduced. Furthermore, by adding a thick resin, that is, the third insulating layer between the third patterned metal layer and the first patterned metal layer and between the third patterned metal layer and the second patterned metal layer, the coupling capacitance can be reduced and the display quality can be further improved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The present application claims priority of China patent application No. 201310731356.8 filed on Dec. 26, 2013, which is incorporated herein by reference in its entirety.

The invention claimed is:

1. An array substrate, comprising: a display region; and a non-display region, disposed at a periphery of the display region, comprising: a gate driver region (GOA region), comprising: a first patterned metal layer, formed on a base substrate; a first insulating layer, formed on the first patterned metal layer; a second patterned metal layer, formed on the first insulating layer; a second insulating layer, covering the second patterned metal layer; and a third patterned metal layer, formed at a side of the second insulating layer away from the base substrate, wherein the third patterned metal layer comprises a plurality of metal wires insulated from each other and connected to the first patterned metal layer and the second patterned metal layer respectively via a plurality of through holes and used as connecting lines between elements of the gate driver region, wherein the plurality of metal wires further comprises a first metal wire and a second metal wire, the first metal wire having one end connected to a patterned metal in the first patterned metal layer and another end connected to another patterned metal in the same first patterned metal layer, the second insulating layer being disposed between the second metal wire and the second patterned metal layer, and the second metal wire having one end connected to a patterned metal of the second patterned metal layer via a first through hole in the second insulating layer and another end connected to another patterned metal of the same second patterned metal layer via a second through hole in the second insulating layer, and wherein the gate driver region includes a plurality of thin film transistors, and at least one of the metal wires in the third patterned metal layer is configured to connect a gate of a first thin film transistor and a source or a drain of a second thin film transistor, wherein the first patterned metal layer comprises a plurality of gates, the first insulating layer is a gate insulating layer, the second patterned metal layer comprises a plurality of sources/drains, and the second insulating layer is a passivation layer, wherein at least another one of the metal wires is used to connect one gate and a source/drain corresponding to the one gate.

2. The array substrate according to claim 1, wherein the at least one of the metal wires is used to connect the gate of the first thin film transistor in the first patterned metal layer and the source or the drain of the second thin film transistor in the second patterned metal layer.

3. The array substrate according to claim 1, wherein the plurality of metal wires are used to connect patterned metals in the first patterned metal layer or patterned metals in the second patterned metal layer.

4. The array substrate according to claim 1, wherein a transparent conducting layer is formed between the second insulating layer and the third patterned metal layer.

5. The array substrate according to claim 4, wherein a third insulating layer is further formed between the second insulating layer and the transparent conducting layer, and the third insulating layer is formed with a through hole therein.

6. The array substrate according to claim 5, wherein the third insulating layer has a thickness of 1~2μm.

7. The array substrate according to claim 1, wherein the plurality of metal wires further comprise some clock signal lines of the gate driver region.

8. The array substrate according to claim 1, wherein the gate driver region further comprises a patterned active layer disposed between the first insulating layer and the second patterned metal layer.

9. The array substrate according to claim 4, wherein the transparent conducting layer and the plurality of metal wires in the third patterned metal layer are conformal.

10. The array substrate according to claim 1, wherein the plurality of metal wires are insulated from each other by an insulating layer coplanar with the third patterned metal layer.

11. A display device, comprising:
the array substrate according to claim 1; and
an opposed substrate, cell-assembled with the array substrate.

12. The array substrate according to claim 1, wherein a third insulating layer is further formed between the second insulating layer and the third patterned metal layer, and the third insulating layer is formed with a through hole therein.

13. The array substrate according to claim 8, wherein at least another one of the metal wires is used to connect one gate and a source/drain corresponding to the one gate.

* * * * *